United States Patent [19]

Zinn

[11] 4,005,314
[45] Jan. 25, 1977

[54] SHORT PULSE GENERATOR

[75] Inventor: Mortimer H. Zinn, Elberon, N.J.

[73] Assignee: The United States of America as represented by the Secretary of the Army, Washington, D.C.

[22] Filed: July 11, 1975

[21] Appl. No.: 595,255

[52] U.S. Cl. .............................. 307/110; 317/260; 321/15
[51] Int. Cl.² ......................................... H02M 3/18
[58] Field of Search ........... 307/108, 110; 317/258, 317/259, 260, 261; 320/1; 321/15

[56] References Cited

UNITED STATES PATENTS

| | | | |
|---|---|---|---|
| 3,111,594 | 11/1963 | Stolte | 307/110 |
| 3,845,322 | 10/1974 | Aslin | 307/110 |
| 3,921,041 | 11/1975 | Stockman | 317/260 |

Primary Examiner—Stuart N. Hecker
Attorney, Agent, or Firm—Nathan Edelberg; Jeremiah G. Murray; Edward Goldberg

[57] ABSTRACT

A device for achieving a narrow high voltage output pulse having a rise time essentially limited only by the rise time of the switching means.

14 Claims, 3 Drawing Figures

SHORT PULSE GENERATOR

The invention described herein may be manufactured and used by, or for the Government for governmental purposes without payment of any royalties thereon or therefor.

BACKGROUND OF THE INVENTION

The present invention relates to high voltage short pulse generators and, more particularly, to a device for obtaining a relatively short high voltage pulse having a rise time essentially limited only by the rise time of the switching means.

Presently known high voltage pulse generators utilize vacuum tubes such as thyratrons or semiconductor devices such as transistors or silicon controlled rectifiers. These devices are generally incorporated in circuit arrangements which utilize an energy storage medium, such as for example, the collapsing magnetic field of an inductive device known as a fly-back transformer utilized in TV receivers, or a capacitor, or a plurality thereof, to provide the high voltage pulse. These circuit arrangements typically provide relatively slow rise times of the high voltage pulse since they are limited by the rise and fall time of the switching means (device) used to discharge and charge the energy storage medium (inductor or capacitor), as well as, the speed of the charge and discharge capability of the energy storage medium. With the state of the art of semiconductors advancing rapidly, high speed switching devices such as electron beam bombarded devices reduced switching rise times to the order of from 1–3 nanoseconds. Therefore the speed of response or the sharpness of rise and fall times of high voltage switching circuit arrangements presently known are limited by the speed of response of the energy storage medium used in conjunction with the switching device.

SUMMARY OF THE INVENTION

It is therefore an object of the present invention to provide a device for obtaining a relatively high voltage output pulse that is essentially limited only by the rise time of the switching device.

It is a further object of the present invention to provide a device which may be used as an energy storage medium and has a rise and fall capability an order of magnitude better than presently known devices.

Another object of the present invention is to provide an energy storage medium adapted to be used with a switching means that is compact and relatively small in size.

Further objects and advantages of the present invention will become apparent to those familiar with the art upon reading the detailed description of the invention.

A device for obtaining a relatively high voltage output pulse, according to the principles of the present invention, is adapted to be coupled to an electrical switching means and a source of charging voltage, and includes a plurality of co-axially disposed, electrically conductive elements. The elements are radially spaced by co-axially disposed insulating means. A pair of the elements, with an insulating means disposed therebetween, extends axially and forms a capacitor. Also included are first means for providing a current path for charging the capacitors in parallel and second means for providing a current path for serially discharging the capacitors through a load.

DESCRIPTION OF THE PREFERRED EMBODIMENT

Figure 1:
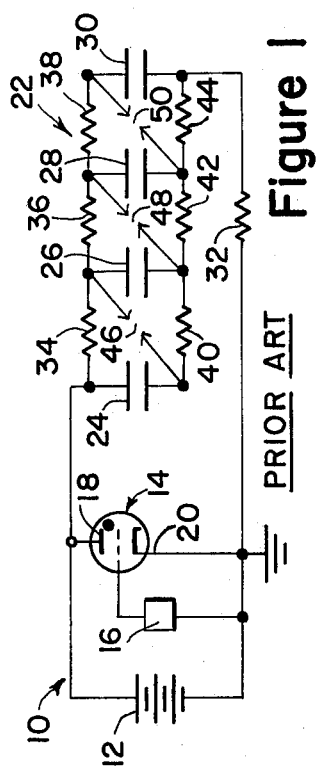
FIG. 1 is a schematic circuit diagram of a high voltage pulse generator known in the prior art.

Referring now to the drawing there is shown in FIG. 1 a circuit arrangement 10 known in the prior art. This circuit arrangement includes a source of voltage 12, a vacuum tube 14 typically known as a thyratron, a means 16 for switching the thyratron 14 on (making it a low impedance between its plate electrode 18 and its cathode electrode 20) and an energy storage network 22.

The energy storage network 22, is of a conventional type well known by those familiar with the art, and includes capacitors 24, 26, 28, and 30. The capacitors are adapted to be charged in parallel through a first current path from a single power source 12 and discharged in series through a second current path which includes a common load 32. The first current or charging path for the capacitors 24–30 includes isolation resistors 34, 36, 38, 40, 42, and 44, which permit the capacitors to be charged in parallel from the voltage source 12. The second current or discharging path for the capacitors 24–30 includes the thyratron vacuum tube 14, preset spark gaps 46, 48, and 50, and the load 32.

Figure 2:
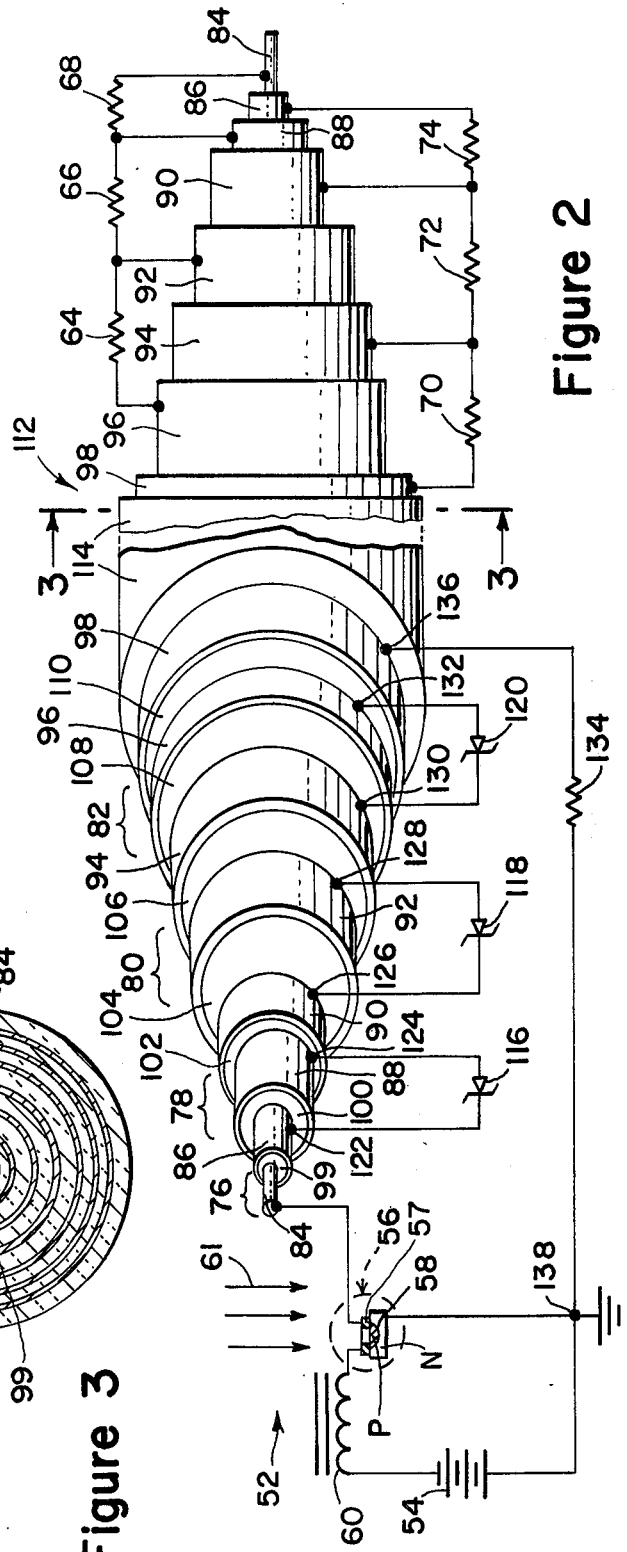
FIG. 2 is a combination schematic circuit diagram and pictorial representation, both in perspective and in elevation, in accordance with the principles of the present invention.

It is to be noted that although isolation resistors have been schematically represented in FIGS. 1 and 2 for illustrative purposes, inductors may be substituted therefor, or any other isolation network without straying from the spirit and scope of the invention as will be fully disclosed herein. Also, although four capacitors with their associated isolation resistors have been schematically represented in FIGS. 1 and 2, it is to be understood that any number of capacitors and associated isolation networks may be utilized. The value of output voltage desired, the value of the voltage source and the hold-off capability of the switching means all contributing to determine the number of capacitors to be used.

Referring now to FIG. 2, there is shown a circuit arrangement 52 similar to the circuit arrangement 10 shown in FIG. 1. The voltage source 54 functions in a similar manner to voltage source 12. Switching means 56, which in the preferred embodiment is an electron bombarded semiconductor device (EBS), functions in a manner similar to the vacuum tube 14. The EBS is turned on (made a low impedance between the back-biased P-N junction 58) when the device is bombarded by an electron beam 61, in a conventional manner. The first or charging current path of the capacitors include inductor 60, isolation resistors or inductors 64, 66, 68, 70, 72, and 74. The capacitors 76, 78, 80, and 82 are obtained by providing a plurality of co-axially disposed, electrically conductive cylindrically shaped elements 84, 86, 88, 90, 92, 94, 96, and 98 with insulating means 99, 100, 102, 104, 106, 108, and 110 disposed therebetween. Capacitor 76 includes conductive elements 84 and 86 with insulating means 99 being disposed therebetween. The value of capacitor 76 being determined by the longitudinal length of the conductive elements and radii thereof, creating the capacitor surface area, the thickness of, and the material used as the insulating means. Element 84 may be a solid conductive material since it is the core of the energy storage device or network 112.

Capacitor 78 is insulated from capacitor 76 by insulating means 100, and includes conductive elements 88 and 90 and insulating means 102 disposed therebetween.

Capacitor 80 is insulated from capacitor 78 by insulating means 104 and includes conductive elements 92 and 94 and insulating means 106 disposed therebetween.

Capacitor 82 is insulated from capacitor 80 by insulating means 108 and includes conductive elements 96 and 98 and insulating means 110 disposed therebetween.

All of the capacitors thus described are protected by an insulating means 114 surrounding conductive element 98.

The preferred embodiment of the present energy storage device 112 is fabricated similar to a conventional co-axial cable but includes a plurality of conductive elements with insulating means disposed between each element. The capacitors being fabricated in the manner thus disclosed, reduce the number and length of the physical wires required, thereby increasing the efficiency of the energy storage device permitting faster rise and fall times for the high voltage output pulse.

The energy storage device is additionally fabricated with each end cut in a staggered or stepped manner exposing each conductive element in order that electrically conducting terminal connections may be provided thereon allowing for the connection thereto of the spark gaps or as shown in the preferred embodiment, the hold-off semiconductor diodes 116, 118 and 120. Diode 116 is connected between terminals 122 and 124 provided on conductive elements 86 and 88, respectively. Diode 118 is connected between terminals 126 and 128 provided on conductive elements 90 and 92, respectively, and diode 120 is connected between terminals 130 and 132 provided on conductive elements 94 and 96, respectively. The load 134 is connected between terminal 136 provided on conductive element 98 and reference ground 138. Ground 138 is also connected to one side of the voltage source 54 and the N electrode of the EBS 56. The other side of the voltage source 54 is coupled, via inductor 60, to conductive element 84, and via terminal connection 57, to the P electrode of EBS 56.

Preferably, the isolation resistors or inductors are connected to the conductive elements by terminals provided thereon and disposed on the opposite end of the conductive elements from the terminals to which the hold-off diodes are connected, thus, providing a simpler more compact assembly. However, operationally they may also be connected to the conductive elements on the same end of the device 112 as the diodes.

The second or discharge current path of capacitors 76, 78, 80, and 82 includes EBS 56, diodes 116, 118, and 120 and the load 134.

Figure 3:
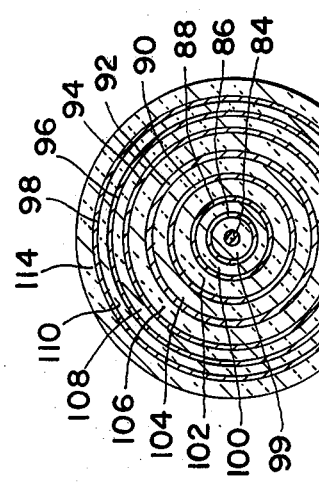
FIG. 3 is a cross-sectional view in elevation along the line 3—3 of FIG. 2.

FIG. 3 is a cross-sectional view of the device 112 taken along the line 3—3 of FIG. 2.

The operation of the circuit arrangement shown in FIG. 2 is as follows. Before the EBS 56 is fired, the voltage across any diode 116, 118, 120, is equal to voltage source 54. After firing of the EBS the voltage across the first diode 116 tries to rise to twice the source voltage as a result of grounding the conductive element 84, via EBS 56. This occurs since one end of the capacitor 76 is coupled to ground while it is fully charged. Before the voltage reaches twice the source voltage, diode 116 breaks down tending to raise the voltage across the second diode 118 to three times the source voltage, thus breaking it down, and so on down the line until all the diodes are conducting. All the capacitors are effectively connected in series and discharge through the load and EBS simultaneously. Thus, a high voltage output pulse may be achieved across the load utilizing a nominal voltage source. The EBS although required to hold-off the source voltage (or twice the source voltage if resonant charging is used) must be capable of handling the full discharge current.

The present circuit arrangement has yielded rise times of 1–3 nanoseconds for an output voltage pulse of 20,000 volts and a source voltage of 150 volts compared to 20–50 nanoseconds achieved with conventional circuitry and a thyratron.

It will be understood that various changes in details, material, arrangement of parts, and operating conditions, which have been herein disclosed and illustrated in order to explain the nature of the invention, may be made by those skilled in the art within the spirit and scope of the present invention.

Having thus set forth the nature of the invention, what is claimed is:

1. A device for obtaining a relatively high voltage output pulse adapted to be coupled to an electrical switching means and a source of charging voltage, said device comprising:
    a. a plurality of co-axially disposed electrically conductive tubular elements, a plurality of separate co-axially disposed insulating layers radially spacing and insulating said conductive elements, adjacent pairs of said conductive elements having respective said insulating layers disposed therebetween extending axially and forming a plurality of capacitors;
    b. first means for providing a current path for charging said capacitors in parallel; and
    c. second means for providing a current path for serially discharging said capacitors into a load.

2. The device according to claim 1 wherein said conductive elements and said insulating, layers are formed as a co-axial cable, the ends of said cable being progressively stepped to expose each of said conductive elements and terminal means disposed upon each said conductive element.

3. The device according to claim 2 wherein said first and second means providing said charging and discharging paths respectively, are formed by conductive means adapted to be connected to said terminal means.

4. The device according to claim 3 wherein said first means providing said charging path includes resistance elements.

5. The device according to claim 4 wherein said second means providing said discharge path includes breakdown means.

6. The device according to claim 5 wherein said breakdown means is a semiconductor device.

7. The device according to claim 3 wherein said first means providing said charging path includes inductor elements.

8. The device according to claim 7 wherein said second means providing said discharge path includes breakdown means.

9. The device according to claim 8 wherein said breakdown means is a semiconductor device.

10. A device for obtaining a relatively narrow high voltage output pulse, comprising:
   a. switch means, said switch means being adapted to be electronically activated;
   b. a plurality of co-axial capacitors formed in a unitary cable including a plurality of radially spaced tubular electrodes and a plurality of insulating layers therebetween spacing said electrodes, pairs of adjacent electrodes forming said capacitors, the ends of said cable being progressively stepped and exposing said electrodes;
   c. load means;
   d. conductive means connected between electrodes of respective capacitors for providing a parallel charging path for said plurality of capacitors, said switch means being connected to said conductive means and said load means, activation of said switch means causing said plurality of capacitors to serially discharge in a path including said load means; and
   e. a plurality of breakdown means disposed in said serial discharge path.

11. The device according to claim 10 wherein said switch means is a beam bombarded semiconductor.

12. The device according to claim 10 wherein said conductive means providing said parallel charging path includes impedance means connecting said capacitor electrodes.

13. The device according to claim 12 wherein said impedance means includes a plurality of resistors.

14. The device according to claim 10 wherein said breakdown means is a plurality of semiconductor diodes.

* * * * *